(12) United States Patent
Ide (10) Patent No.: US 9,523,746 B2
(45) Date of Patent: Dec. 20, 2016

(54) GIANT MAGNETORESISTANCE ELEMENT AND CURRENT SENSOR USING THE SAME

(71) Applicant: ALPS ELECTRIC CO., LTD., Tokyo (JP)

(72) Inventor: Yosuke Ide, Niigata-ken (JP)

(73) Assignee: ALPS ELECTRIC CO., LTD., Tokyo (JP)

(*) Notice: Subject to any disclaimer, the term of this patent is extended or adjusted under 35 U.S.C. 154(b) by 13 days.

(21) Appl. No.: 14/789,781

(22) Filed: Jul. 1, 2015

(65) Prior Publication Data

US 2015/0377985 A1    Dec. 31, 2015

Related U.S. Application Data

(63) Continuation of application No. PCT/JP2014/050150, filed on Jan. 8, 2014.

(30) Foreign Application Priority Data

Feb. 4, 2013    (JP) .................. 2013-019805

(51) Int. Cl.
| | |
|---|---|
| *G01R 33/09* | (2006.01) |
| *H01L 43/08* | (2006.01) |
| *H01L 43/10* | (2006.01) |
| *G01R 15/20* | (2006.01) |
| *G11B 5/39* | (2006.01) |

(52) U.S. Cl.
CPC ............ *G01R 33/093* (2013.01); *G01R 15/205* (2013.01); *G11B 5/3903* (2013.01); *H01L 43/08* (2013.01); *H01L 43/10* (2013.01); *G11B 2005/3996* (2013.01)

(58) Field of Classification Search
CPC ... G01R 33/093; G01R 15/205; G11B 5/3903; G11B 2005/3996; H01L 43/10
USPC ........................................................ 324/252
See application file for complete search history.

(56) References Cited

U.S. PATENT DOCUMENTS

| | | | |
|---|---|---|---|
| 4,614,869 | A | 9/1986 | Hoshino et al. |
| 2002/0058158 | A1 | 5/2002 | Odagawa et al. |
| 2010/0073827 | A1* | 3/2010 | Zhao ............... B82Y 10/00 360/324.2 |
| 2012/0002330 | A1* | 1/2012 | Matsuzawa ....... B82Y 10/00 360/313 |
| 2014/0145792 | A1* | 5/2014 | Wang .............. H01F 10/3272 331/94.1 |

(Continued)

FOREIGN PATENT DOCUMENTS

| | | |
|---|---|---|
| EP | 0871231 | 10/1998 |
| JP | 2008-78378 | 4/2008 |
| JP | 4614869 | 10/2010 |

OTHER PUBLICATIONS

Search Report dated Mar. 25, 2014 from International Application No. PCT/JP2014/050150.

*Primary Examiner* — Christopher Mahoney
(74) *Attorney, Agent, or Firm* — Beyer Law Group LLP (57) ABSTRACT

A GMR element includes a fixed magnetic layer in which magnetization is fixed; a free magnetic layer in which magnetization is changed by an external magnetic field; and a spacer layer which is positioned between the fixed magnetic layer and the free magnetic layer, in which the free magnetic layer is formed by laminating a CoFe alloy and a CoFeB alloy. A current sensor uses the GMR element.

4 Claims, 5 Drawing Sheets

(56) References Cited

U.S. PATENT DOCUMENTS

2014/0183673 A1\* 7/2014 Zhang ................ H01L 29/82
 257/421
2014/0248719 A1\* 9/2014 Zhou ................. G11C 11/161
 438/3

\* cited by examiner

*Prior Art*

FIG. 9

*Prior Art*

FIG. 10

*Prior Art*

GIANT MAGNETORESISTANCE ELEMENT AND CURRENT SENSOR USING THE SAME

CLAIM OF PRIORITY

This application is a Continuation of International Application No. PCT/JP2014/050150 filed on Jan. 8, 2014, which claims benefit of Japanese Patent Application No. 2013-019805 filed on Feb. 4, 2013. The entire contents of each application noted above are hereby incorporated by reference.

BACKGROUND OF THE INVENTION

1. Field of the Invention

The present invention relates to a giant magnetoresistance element (hereinafter, referred to as a GMR element) and a current sensor using the GMR element.

2. Description of the Related Art

Recently, a magnetic sensor which detects a magnetic field has been widely used in magnetism application products which have been widely used. In addition, as an application of the magnetic sensor, a current sensor which measures a current without contacts by detecting a magnetic field generated by current that flows through a conductor has also been widely used. Furthermore, the current sensor is used for measuring a relatively low current without contact as in electric appliances at home, or is used for measuring a relatively high current without contact as in an electric vehicle, a hybrid car, or the like.

Figure 8:
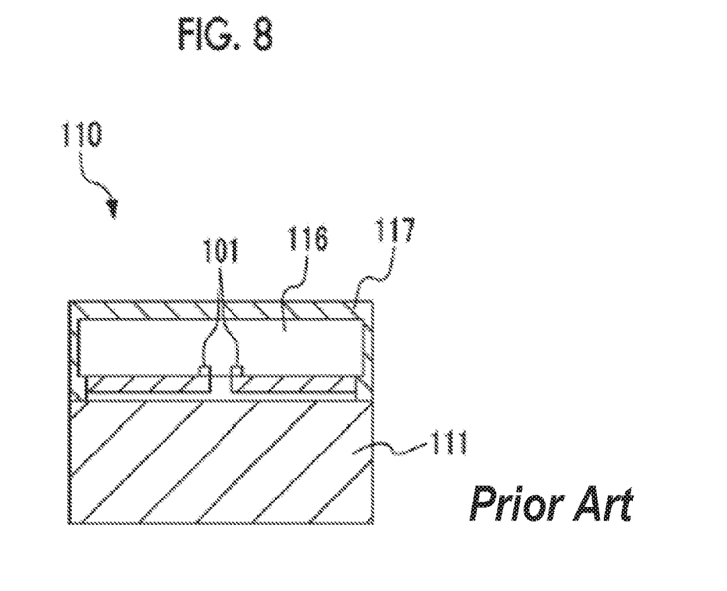
FIG. 8 is an explanatory view of a current sensor disclosed in Japanese Unexamined Patent Application Publication No. 2007-121283.

FIG. 8 is an explanatory view of a current sensor disclosed in Japanese Unexamined Patent Application Publication No. 2007-121283. As illustrated in FIG. 8, a current sensor 110 disclosed in Japanese Unexamined Patent Application Publication No. 2007-121283 is configured so that magnetoresistance elements 101 such as GMR elements which are formed in a semiconductor chip 116 are embedded in a housing 117. In addition, the current sensor 110 is disposed at a predetermined position on a conductor 111 though which current flows, and measures the current by detecting a magnetic field generated by the current.

Figure 9:
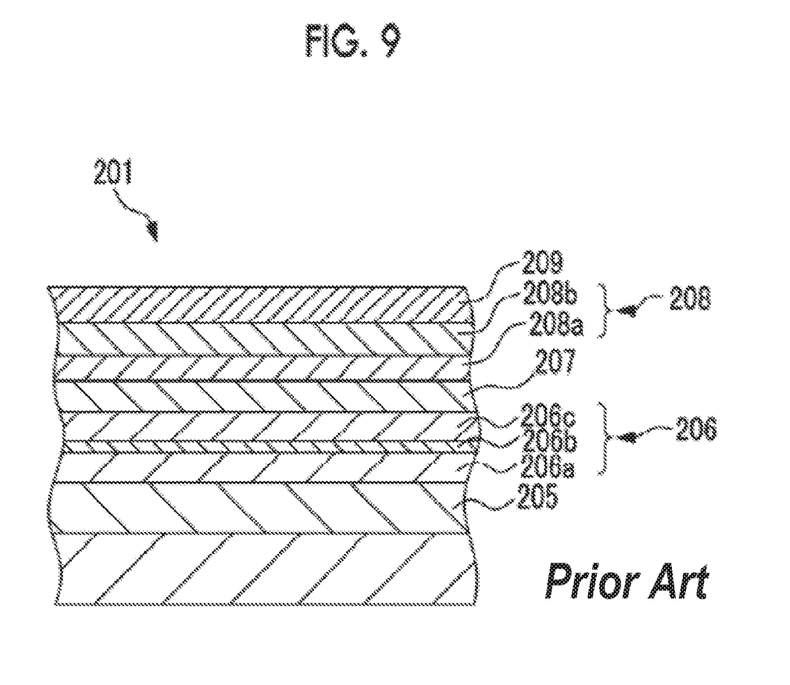
FIG. 9 is an explanatory view of a GMR element disclosed in Japanese Unexamined Patent Application Publication No. 2004-164837.

FIG. 9 is an explanatory view of a GMR element disclosed in Japanese Unexamined Patent Application Publication No. 2004-164837. As illustrated in FIG. 9, a GMR element 201 disclosed in Japanese Unexamined Patent Application Publication No. 2004-164837 has a structure in which an antiferromagnetic layer (PtMn) 205, a fixed magnetic layer (CoFe/Ru/CoFe) 206, a spacer layer (CuO) 207, a free magnetic layer (CoFe/NiFe) 208, and a protective layer (Ta) 209 are laminated in this order.

As described above, in Japanese Unexamined Patent Application Publication No. 2004-164837, the free magnetic layer 208 has a structure in which CoFe having a high spin polarizability and NiFe having excellent soft magnetic properties are laminated. Therefore, the GMR element having a high resistance change ratio $\Delta R/R_{min}$ and a small degree of hysteresis in a magnetization curve can be realized.

In addition, as the magnetism application products, there are a magnetic head of a hard disk drive, and a tunnel magnetoresistance element (hereinafter, referred to as a TMR element) which is generally used as a magnetoresistive random-access memory (MRAM).

Figure 10:
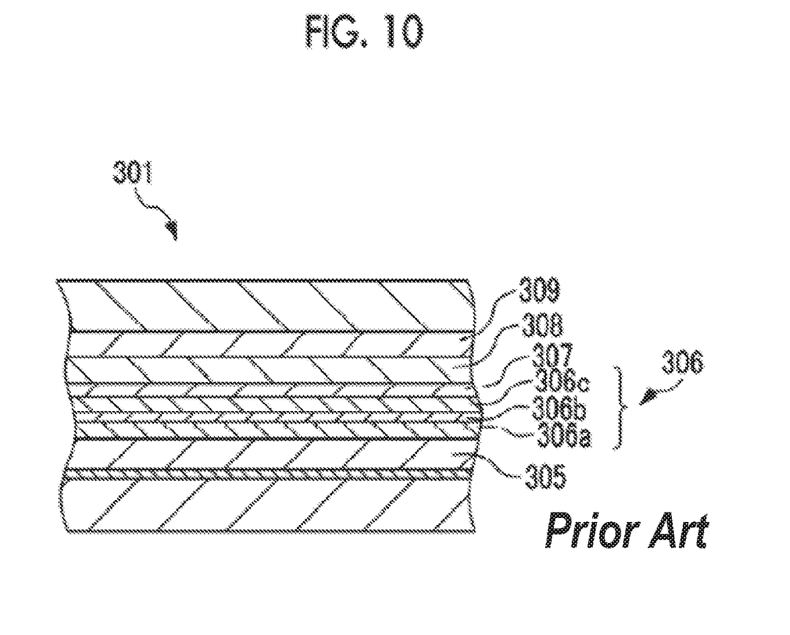
FIG. 10 is an explanatory view of a TMR element disclosed in Japanese Unexamined Patent Application Publication No. 2010-097981.

FIG. 10 is an explanatory view of a TMR element disclosed in Japanese Unexamined Patent Application Publication No. 2010-097981. As illustrated in FIG. 10, a TMR element 301 disclosed in Japanese Unexamined Patent Application Publication No. 2010-097981 has a structure in which an antiferromagnetic layer (IrMn) 305, a first fixed magnetic layer (CoFe) 306a, a non-magnetic intermediate layer (antiferromagnetic coupling layer) (Ru) 306b, a second fixed magnetic layer (CoFeB) 306c, a tunnel barrier layer (MgO) 307, a free magnetic layer 308, and a protective layer 309 are laminated in this order.

It is known that the TMR element 301 can obtain a high resistance change ratio $\Delta R/R_{min}$ (MR ratio) by allowing MgO of the tunnel barrier layer 307 to be crystallographically oriented in the (001) direction. In addition, it is known that MgO is crystallographically oriented in the (001) direction of a rock-salt structure by being formed on an amorphous base layer. Therefore, in Japanese Unexamined Patent Application Publication No. 2010-097981, the tunnel barrier layer (MgO) 307 is formed on the second fixed magnetic layer (CoFeB) 306c which is formed as an amorphous film.

In Japanese Unexamined Patent Application Publication No. 2010-097981, thereafter, CoFeB of the second fixed magnetic layer 306c which is formed as an amorphous film is allowed to follow the crystal structure of the MgO interface of the tunnel barrier layer 307 and is crystallized by a heat treatment. The reason for this is that CoFeB of the second fixed magnetic layer 306c has a body-centered cubic structure on the surface side which comes into contact with the tunnel barrier layer (MgO) 307 and is crystallographically oriented in the (001) direction, and thus a high resistance change ratio $\Delta R/R_{min}$ is realized. However, this structure is a structure unique to the TMR element having the tunnel barrier layer and cannot be applied to a GMR element.

However, in order to realize a current sensor which uses a GMR element that can measure current from a relatively low current to a high current with high accuracy, it is necessary to widen an output linearity range which is a range in which the output has linearity with respect to a change in the magnetic field of the GMR element while suppressing the hysteresis of the GMR element. There are two methods to widen the output linearity range. The first method is to increase shape magnetic anisotropy by reducing the dimension of a long pattern of the GMR element in the width direction perpendicular to the longitudinal direction. However, there is a limit to a reduction in the dimension of the long pattern in the width direction, and the dimension in the width direction has been reduced to almost the limit due to the requirements such as a reduction in size and a reduction in cost. The second method is to increase the magnetic moment $M_s \cdot t$ of the free magnetic layer. However, in a method of increasing the magnetic moment $M_s \cdot t$ by increasing the film thickness t of the free magnetic layer in which a CoFe alloy and a NiFe alloy are laminated in the related art, the resistance change ratio $\Delta R/R_{min}$ is significantly reduced.

SUMMARY OF THE INVENTION

The present invention provides a giant magnetoresistance element having a high resistance change ratio $\Delta R/R_{min}$ and a wide output linearity range and a current sensor using the same.

According to an aspect of the present invention, there is provided a giant magnetoresistance element including: a fixed magnetic layer in which magnetization is fixed; a free magnetic layer in which magnetization is changed by an external magnetic field; and a spacer layer which is positioned between the fixed magnetic layer and the free magnetic layer, in which the free magnetic layer is formed by laminating a CoFe alloy and a CoFeB alloy.

According to this aspect, the resistivity of a CoFeB alloy is high, and thus the resistance change ratio $\Delta R/R_{min}$ of the GMR element can be increased.

According to this aspect, when the output linearity range of the GMR element is widened by increasing the magnetic moment $M_s \cdot t$ of the free magnetic layer, a reduction in resistance change ratio $\Delta R/R_{min}$ can be suppressed to be small.

Therefore, according to this aspect of the present invention, a GMR element having a high resistance change ratio $\Delta R/R_{min}$ and a wide output linearity range can be provided.

It is preferable that a film thickness of the CoFe alloy is 2 nm or more and 4 nm or less. According to this aspect, the resistance change ratio $\Delta R/R_{min}$ can be further increased. As a result, the output linearity range of the GMR element can be further increased.

It is preferable that a film thickness of the CoFeB alloy is 5 nm or more and 14 nm or less. According to this aspect, magnetostriction can be suppressed to be ±1 ppm or less. Therefore, hysteresis which occurs due to stress is suppressed, and thus a highly accurate GMR element can be realized.

It is preferable that the CoFeB alloy has an amorphous structure. According to this aspect, the resistivity of the CoFeB alloy can be increased, and thus the resistance change ratio $\Delta R/R_{min}$ of the GMR element can be further increased.

It is preferable that when the CoFe alloy is represented by a $Co_XFe_{100-X}$ alloy and the CoFeB alloy is represented by a $(Co_YFe_{100-Y})_{100-Z}B_Z$ alloy, X satisfies 80 atom %≤X<100 atom %, Y satisfies 80 atom %≤Y<100 atom %, and Z satisfies 10 atom %≤Z≤30 atom %. According to this aspect, a GMR element having good characteristics can be realized.

According to another aspect of the present invention, there is provided a current sensor which uses the giant magnetoresistance element described above.

According to this aspect, a current sensor which uses the GMR element having a high resistance change ratio $\Delta R/R_{min}$ and a wide output linearity range can be provided.

Therefore, according to the above aspects of the present invention, a GMR element having a high resistance change ratio $\Delta R/R_{mm}$ and a wide output linearity range and a current sensor using the same can be provided.

DESCRIPTION OF THE PREFERRED EMBODIMENTS

Hereinafter, a GMR element of an embodiment of the present invention and a current sensor using the same will be described in detail with reference to the drawings. In addition, the dimensions shown in the drawings may be appropriately changed.

Figure 1:
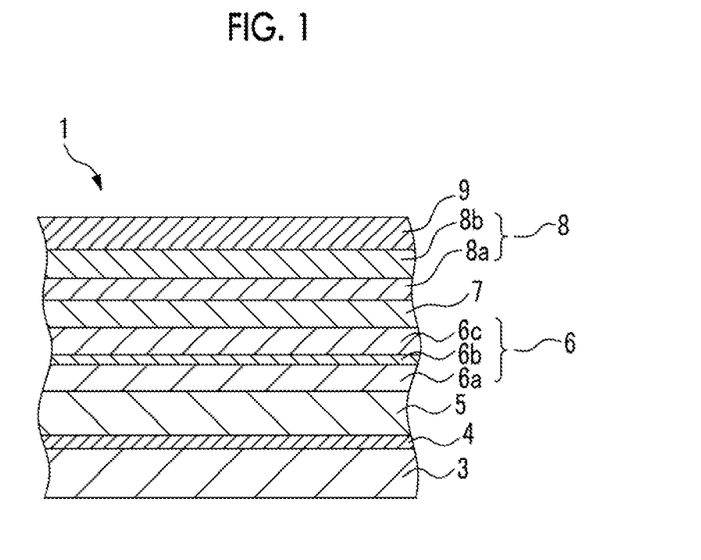
FIG. 1 is an explanatory view illustrating the layer configuration of a GMR element according to an embodiment of the present invention.
Figure 2:
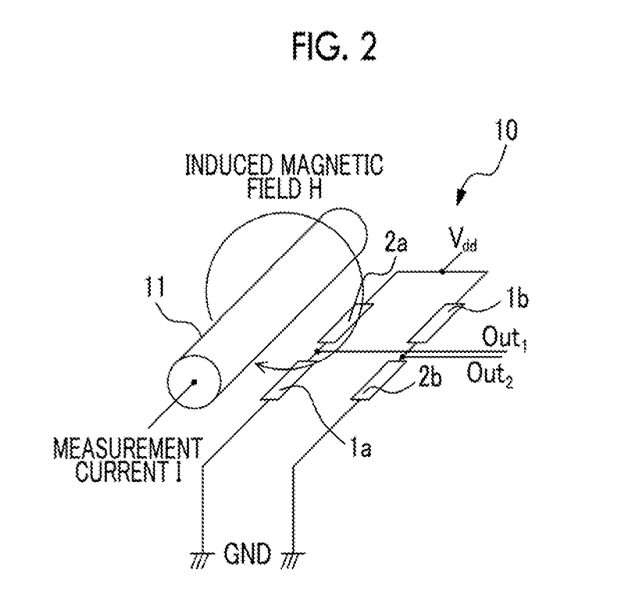
FIG. 2 is an explanatory view of a current sensor according to the embodiment of the present invention.

FIG. 1 is an explanatory view illustrating the layer configuration of the giant magnetoresistance element according to the embodiment of the present invention. FIG. 2 is an explanatory view of the current sensor according to the embodiment of the present invention.

A current sensor 10 of this embodiment is a magnetic proportion type current sensor. As illustrated in FIG. 2, the current sensor 10 of this embodiment includes a bridge circuit that includes two GMR elements 1a and 1b which are magnetic detection elements and two fixed resistance elements 2a and 2b. In addition, the current sensor 10 is disposed in the vicinity of a conductor 11 through which measurement current I flows, and detects an induced magnetic field H which is generated by the measurement current I. At this time, the current sensor 10 obtains an output which is substantially proportional to the induced magnetic field H generated by the measurement current I.

In the bridge circuit illustrated in FIG. 2, one terminal of the GMR element 1b and one terminal of the fixed resistance element 2a are respectively connected to a power source terminal $V_{dd}$, and one terminal of the GMR element 1a and one terminal of the fixed resistance element 2b are respectively connected to a ground terminal GND. The other terminal of the GMR element 1a and the other terminal of the fixed resistance element 2a are connected to each other to form a first output $Out_1$, and the other terminal of the GMR element 1b and the other terminal of the fixed resistance element 2b are connected to each other to form a second output $Out_2$.

The GMR elements 1a and 1b have a property in which the electric resistance is changed by the applied induced magnetic field H generated by the measurement current I, and thus the first output $Out_1$ and the second output $Out_2$ are changed by the induced magnetic field H generated by the measurement current I. The voltage difference between the first output $Out_1$ and the second output $Out_2$ is substantially proportional to the induced magnetic field H, and the voltage difference is the output of the current sensor 10. In addition, the configuration of the bridge circuit is not limited to that illustrated in FIG. 2. For example, the bridge circuit may be configured by combining one GMR element and three fixed resistance elements, and the bridge circuit may also be configured by combining four GMR elements. In addition, the present invention is not limited to including the bridge circuit. For example, the GMR element may be connected to the fixed resistance element in series to extract an output from between the GMR element and the fixed resistance element.

As illustrated in FIG. 1, the GMR element 1 according to this embodiment has a structure in which a lower gap layer 3, a seed layer 4, an antiferromagnetic layer 5, a fixed magnetic layer 6, a spacer layer 7, a free magnetic layer 8, and a protective layer 9 are laminated in this order.

The lower gap layer 3 is formed on a silicon substrate (not illustrated) or the like and is made of an insulating material such as alumina ($Al_2O_3$). The seed layer 4 is a base layer for aligning the crystal growth of the antiferromagnetic layer 5 and each of layers which are laminated on the antiferromagnetic layer 5, and is formed of an NiFe alloy, an NiCr alloy, an NiFeCr alloy, Cr, or the like.

The antiferromagnetic layer 5 generates a strong exchange coupling magnetic field between the antiferromagnetic layer 5 and the fixed magnetic layer 6 by a heat treatment, and thus fixes the magnetization direction of the fixed magnetic layer 6 (fixed magnetization direction). The antiferromagnetic layer 5 is formed of a PtMn Alloy or an X—Mn alloy (here, X is one type or two or more types of elements Pd, Ir, Rh, Ru, Os, Ni, and Fe). Otherwise, the antiferromagnetic layer 5 is formed of a Pt—Mn—Y alloy (here, Y is one type or two or more types of elements Pd, Ir, Rh, Ru, Au, Ag, Os, Cr, Ni, Ar, Ne, Xe, and Kr). The structure of such an alloy is a disordered face-centered cubic (fcc) structure immediately after film formation, and is transformed to a CuAuI (CuAuI) type ordered face-centered tetragonal (fct) structure when a heat treatment is performed thereon. Therefore, when the antiferromagnetic layer 5 is formed by using the alloy, by performing a heat treatment, a strong exchange coupling magnetic field can be generated between the antiferromagnetic layer 5 and the fixed magnetic layer 6.

The fixed magnetic layer 6 has a laminated ferri-pinned structure including a first fixed magnetic layer 6a, a non-magnetic intermediate layer 6b, and a second fixed magnetic layer 6c, the magnetization of the first fixed magnetic layer 6a is fixed in the width direction of a long pattern by exchange coupling with the antiferromagnetic layer 5, and the magnetization of the second fixed magnetic layer 6c is fixed in a direction (antiparallel direction) which is different from the magnetization direction of the first fixed magnetic layer 6a by 180° via the non-magnetic intermediate layer 6b. As described above, when the fixed magnetic layer 6 has the laminated ferri-pinned structure, by the synergy effect of the antiparallel coupling which is generated between the first and second fixed magnetic layers 6a and 6c via the non-magnetic intermediate layer 6b and the exchange coupling between the first fixed magnetic layer 6a and the antiferromagnetic layer 5, the magnetization direction of the fixed magnetic layer 6 can be more stably fixed. In addition, the fixed magnetic layer 6 may also have a single layer structure.

The first and second fixed magnetic layers 6a and 6c are formed of a ferromagnetic material, and, for example, are formed of an NiFe alloy, Co, a CoNiFe alloy, a CoFe alloy, a CoNi alloy, or the like. Particularly, it is preferable that the first and second fixed magnetic layers 6a and 6c are formed of a CoFe alloy or Co. In addition, it is preferable that the first fixed magnetic layer 6a and the second fixed magnetic layer 6c are formed of the same material. The non-magnetic intermediate layer 6b is formed of a non-magnetic material, and may be formed of one type or two or more types from Ru, Rh, Pd, Ir, Os, Re, Cr, Cu, Pt, and Au. Particularly, it is preferable that the non-magnetic intermediate layer 6b is formed of Ru or Cu.

The spacer layer 7 is a layer which prevents the magnetic coupling between the fixed magnetic layer 6 and the free magnetic layer 8 and is a layer through which detection current mainly flows. The spacer layer 7 is formed of a non-magnetic material having conductivity such as Cu, Cr, Au, or Ag. Particularly, it is preferable that the spacer layer 7 is formed of Cu.

As illustrated in FIG. 1, the free magnetic layer 8 has a configuration in which a first free magnetic layer 8a and a second free magnetic layer 8b are laminated. The first free magnetic layer 8a is made of a CoFe alloy, and the second free magnetic layer 8b is made of a CoFeB alloy having an amorphous structure. In addition, when the CoFe alloy of the first free magnetic layer 8a is represented by a $Co_XFe_{100-X}$ alloy and the CoFeB alloy of the second free magnetic layer 8b is represented by a $(Co_YFe_{100-Y})_{100-Z}B_Z$ alloy, X satisfies 80 atom %≤X<100 atom %, Y satisfies 80 atom %≤Y<100 atom %, and Z satisfies 10 atom %≤Z≤30 atom %. In addition, in the expressions $Co_XFe_{100-X}$ and $(Co_YFe_{100-Y})_{100-Z}B_Z$, the attached numbers, that is, X, 100−X, Y, 100−Y, 100−Z, and Z mean the contents of the elements to which the numbers are attached. In addition, both of the CoFe alloy and the CoFeB alloy may contain a small amount of other impurities. The protective layer 9 is formed of Ta (tantalum) or the like.

The electric resistance R of the GMR element is changed by the magnetization direction of the free magnetic layer. When the magnetization direction of the free magnetic layer is a direction parallel to the fixed magnetization direction of the fixed magnetic layer, the electric resistance R of the GMR element becomes the minimum electric resistance $R_{min}$. This is because, as illustrated in FIG. 1, in addition to the spacer layer 7, the free magnetic layer 8 including the first free magnetic layer 8a and the second free magnetic layer 8b also contributes to the flow of electrons.

As the magnetization direction of the free magnetic layer is a direction which is not parallel to the fixed magnetization direction of the fixed magnetic layer, the electric resistance R of the GMR element increases. In addition, when the magnetization direction of the free magnetic layer is a direction antiparallel to the fixed magnetization direction of the fixed magnetic layer, the electric resistance R of the GMR element becomes the maximum electric resistance $R_{max}$. At this time, a change in resistance difference $R-R_{min}$ is generally represented by ΔR, and a resistance change ratio $ΔR/R_{min}$ is defined.

In addition, when the magnetization direction of the free magnetic layer 8 is a direction antiparallel to the fixed magnetization direction of the fixed magnetic layer 6, the flow of electrons branches off into the free magnetic layer 8, that is, into the first free magnetic layer 8a and the second free magnetic layer 8b (shunt loss). Therefore, in order to increase the resistance change ratio $ΔR/R_{min}$ by further increasing the maximum electric resistance $R_{max}$, the branched flow of electrons (shunt loss) needs to be reduced. Accordingly, in order to reduce the branched flow of electrons (shunt loss), it is preferable that the electric resistance of the second free magnetic layer 8b (CoFeB alloy) is increased.

Figure 3:
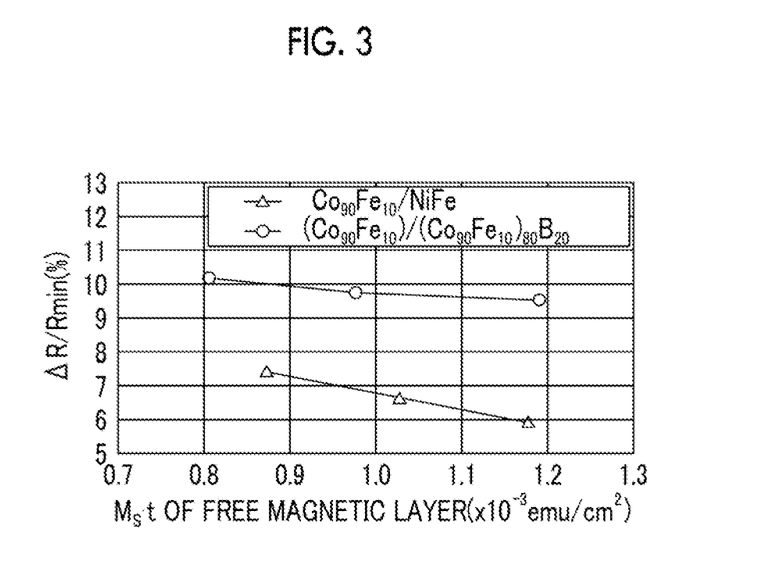
FIG. 3 is experimental data illustrating the relationship between resistance change ratio $\Delta R/R_{min}$ and $M_s \cdot t$.

FIG. 3 is experimental data illustrating the relationship between the resistance change ratio $ΔR/R_{mm}$ and $M_s·t$. In FIG. 3, in a case of the GMR element 1 (illustrated in FIG. 1) according to this embodiment in which the free magnetic layer is a $Co_{90}Fe_{10}/(Co_{90}Fe_{10})_{80}B_{20}$ laminated film (hereinafter, referred to as an example), the relationship between the resistance change ratio $ΔR/R_{min}$ and $M_s·t$ of the free magnetic layer is compared to that in a case of a GMR element 201 (illustrated in FIG. 9) of the related art disclosed in Japanese Unexamined Patent Application Publication No. 2004-164837 in which the free magnetic layer is a $Co_{90}Fe_{10}/NiFe$ laminated film (hereinafter, referred to as a comparative example). In addition, $(Co_{90}Fe_{10})_{80}B_{20}$ means an alloy obtained by adding 20 atom % of B (boron) to the $Co_{90}Fe_{10}$ alloy.

$M_s \cdot t$ indicates the magnetic moment (magnetic film thickness) per unit area of a magnetic layer and is the product $(M_s \times t)$ of the saturation magnetization Ms of the magnetic layer and the film thickness t of the magnetic layer. $M_s \cdot t$ represented by the horizontal axis of FIG. 3 is the product of the saturation magnetization Ms of each of the free magnetic layers and the film thickness t of the free magnetic layer. In addition, while the saturation magnetization Ms is constant, $M_s \cdot t$ illustrated in FIG. 3 is changed by changing the film thickness of the $(Co_{90}Fe_{10})_{80}B_{20}$ alloy in the GMR element 1 of the example and by changing the film thickness of the NiFe alloy in the GMR element 201 of the comparative example. In addition, the vertical axis of FIG. 3 represents the resistance change ratio $\Delta R/R_{min}$.

As illustrated in FIG. 3, the GMR element 1 of the example has a higher resistance change ratio $\Delta R/R_{min}$ than that of the GMR element 201 of the comparative example. Therefore, the GMR element 1 of the example has a higher resistance change ratio $\Delta R/R_{min}$ and a higher sensitivity to a change in external magnetic field than those of the GMR element 201 of the comparative example. Therefore, the current sensor 10 (illustrated in FIG. 2) using the GMR element 1 according to this embodiment has a higher sensitivity to a change in measurement current I (illustrated in FIG. 2) than that of a current sensor using the GMR element 201 of the comparative example.

In addition, a reduction in $\Delta R/R_{min}$ due to an increase in the $M_s \cdot t$ of the GMR element 1 of the example is smaller than that of the GMR element 201 of the comparative example. Therefore, even in a case where the output linearity range is increased, a GMR element 1 having a high resistance change ratio $\Delta R/R_{min}$ can be realized. In addition, a change in the resistance change ratio $\Delta R/R_{min}$ due to variations in the film thickness of the free magnetic layer of the GMR element 1 of the example is smaller than that of the GMR element 201 of the comparative example. Therefore, in the GMR element 1 and the current sensor 10 (illustrated in FIG. 2) using the GMR element 1 according to this embodiment, the resistance change ratio $\Delta R/R_{min}$ is stabilized and thus higher accuracy is achieved compared to the GMR element 201 including the free magnetic layer $Co_{90}Fe_{10}/NiFe$ and the current sensor using the GMR element 201 of the related art.

The reason why the $\Delta R/R_{min}$ is high and a reduction in the $\Delta R/R_{min}$ due to an increase in the $M_s \cdot t$ is small in the GMR element 1 of the example compared to the GMR element 201 of the comparative example is that the resistivity (about 100 $\mu\Omega cm$) of the CoFeB alloy is about 5 times the resistivity (about 20 $\mu\Omega cm$) of the NiFe alloy and thus the flow of electrons branched off into the CoFeB alloy, that is, shunt loss can be suppressed compared to the flow of electrons branched off into the NiFe alloy.

Therefore, according to this embodiment, a GMR element having a high resistance change ratio $\Delta R/R_{min}$ and a current sensor using the same can be provided.

Figure 4:
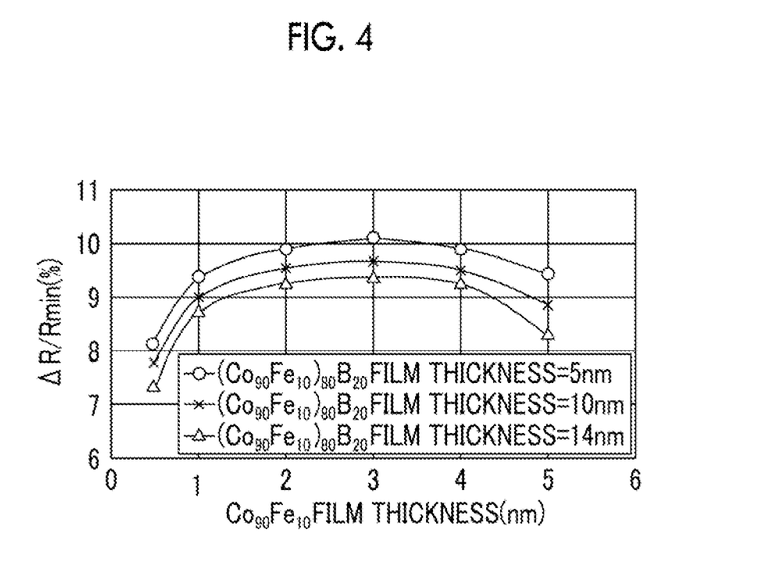
FIG. 4 is experimental data illustrating the relationship between the resistance change ratio $\Delta R/R_{min}$ and the film thickness of a free magnetic layer.

FIG. 4 is experimental data illustrating the relationship between the resistance change ratio $\Delta R/R_{min}$ and the film thickness of the free magnetic layer, and illustrates a case where the free magnetic layer is a $Co_{90}Fe_{10}/(Co_{90}Fe_{10})_{80}B_{20}$ laminated film. The vertical axis of FIG. 4 represents the resistance change ratio $\Delta R/R_{min}$ and the horizontal axis represents the film thickness of the first free magnetic layer 8a ($Co_{90}Fe_{10}$ alloy). In addition, by using the film thickness of the second free magnetic layer 8b ($(Co_{90}Fe_{10})_{80}B_{20}$) as a parameter, the relationship between the resistance change ratio $\Delta R/R_{min}$ and the film thickness of the first free magnetic layer 8a is illustrated.

As illustrated in FIG. 4, in a range of 2 nm or more and 4 nm or less regarding the film thickness of the first free magnetic layer 8a (CoFe alloy) (illustrated in FIG. 1), it is seen that the resistance change ratio $\Delta R/R_{min}$ of the GMR element 1 (illustrated in FIG. 1) is high regardless of the film thickness of the second free magnetic layer 8b (illustrated in FIG. 1). Therefore, when the film thickness of the first free magnetic layer 8a (illustrated in FIG. 1) is in a range of 2 nm or more and 4 nm or less, the GMR element 1 (illustrated in FIG. 1) according to this embodiment has high sensitivity to a change in external magnetic field. Therefore, when the film thickness of the first free magnetic layer 8a (illustrated in FIG. 1) is in a range of 2 nm or more and 4 nm or less, the current sensor 10 (illustrated in FIG. 2) using the GMR element 1 (illustrated in FIG. 1) has high sensitivity to a change in measurement current I (illustrated in FIG. 2). Accordingly, it is preferable that the film thickness of the first free magnetic layer 8a (CoFe alloy) (illustrated in FIG. 1) is in a range of 2 nm or more and 4 nm or less.

Figure 5:
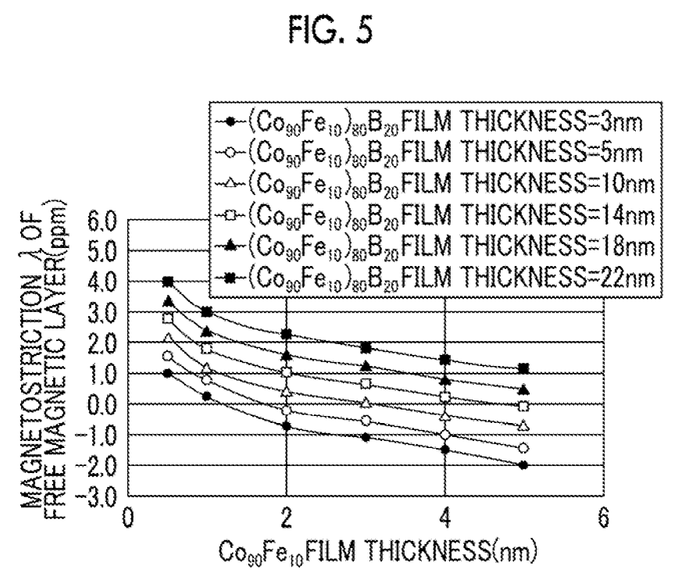
FIG. 5 is experimental data illustrating the relationship between the magnetostriction λ of the free magnetic layer and the film thickness of the free magnetic layer.

FIG. 5 is experimental data illustrating the relationship between the magnetostriction $\lambda$ of the free magnetic layer and the film thickness of the free magnetic layer, and illustrates a case where the free magnetic layer is a $Co_{90}Fe_{10}/(Co_{90}Fe_{10})_{80}B_{20}$ laminated film. The vertical axis of FIG. 5 represents the magnetostriction $\lambda$ of the free magnetic layer and the horizontal axis represents the film thickness of the first free magnetic layer 8a ($Co_{90}Fe_{10}$ alloy). In addition, by using the film thickness of the second free magnetic layer 8b ($(Co_{90}Fe_{10})_{80}B_{20}$) as a parameter, the relationship between the magnetostriction $\lambda$ of the free magnetic layer and the film thickness of the first free magnetic layer 8a is illustrated.

In general, when a chip including a GMR element or the like which is cut out from a substrate is sealed in a package, stress is applied to the chip. Due to the stress, magnetoelastic anisotropy (inverse magnetostrictive effect) occurs in the free magnetic layer, and thus hysteresis is likely to occur in a characteristic curve of the GMR element, for example, a magnetization curve or a correlation diagram of the electric resistance and the measurement current I (illustrated in FIG. 2). In order to suppress this, it is preferable that the magnetostriction $\lambda$ of the free magnetic layer is about zero.

As illustrated in FIG. 5, with a focus on the film thickness of the first free magnetic layer 8a in a range of 2 nm or more and 4 nm or less in which the resistance change ratio $\Delta R/R_{min}$ can be increased, it is preferable that the magnetostriction $\lambda$ of the free magnetic layer is ±1 ppm or less in a range of 5 nm or more and 14 nm or less regarding the film thickness of the second free magnetic layer 8b.

As described above, when the film thickness of the second free magnetic layer 8b is 5 nm or more and 14 nm or less, hysteresis which occurs due the stress on the GMR element 1 (illustrated in FIG. 1) according to this embodiment is suppressed. Therefore, when the film thickness of the second free magnetic layer 8b is 5 nm or more and 14 nm or less, a highly accurate GMR element can be provided, and a current sensor using the highly accurate GMR element can be realized.

Figure 6:
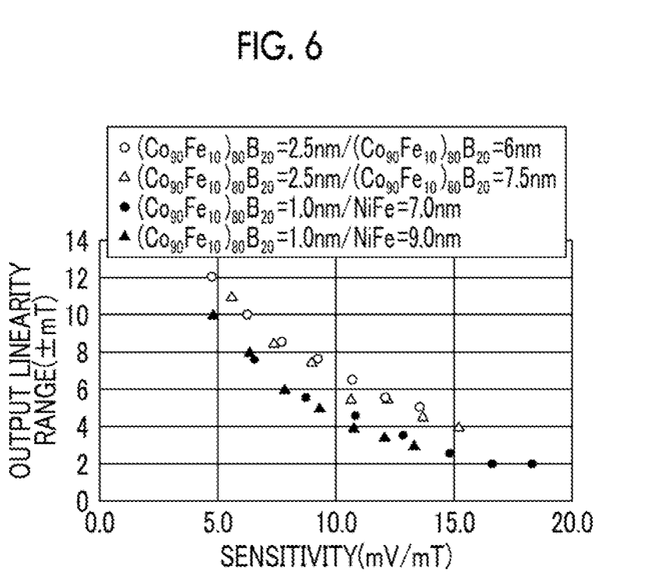
FIG. 6 is experimental data illustrating the relationship between the output linearity range and sensitivity in the current sensor.

FIG. 6 is experimental data illustrating the relationship between the output linearity range and the sensitivity in the current sensor. The vertical axis of FIG. 6 represents the output linearity range in which linearity in the output of the current sensor can be obtained, and represents the range (±mT) of the induced magnetic field H (illustrated in FIG. 2)

in which the percentage result obtained by dividing the maximum amount of deviation (mV) between an output curve and the linear approximation line thereof by the difference (full scale) between the maximum value and the minimum value of the output curve is 0.3% or less. The horizontal axis of FIG. 6 represents the slope of the output (mV) with respect to the induced magnetic field H (mT), that is, the sensitivity (mV/mT). In FIG. 6, the current sensor using the GMR element of the related art in which the free magnetic layer is made of $Co_{90}Fe_{10}/Ni_{81}Fe_{19}$ and the current sensor 10 (illustrated in FIG. 2) using the GMR element of this embodiment in which the free magnetic layer is made of $Co_{90}Fe_{10}/(Co_{90}Fe_{10})_{80}B_{20}$ are compared to each other for evaluation. In addition, in the illustration of FIG. 6, the film thicknesses of $Co_{90}Fe_{10}$ and $(Co_{90}Fe_{10})_{80}B_{20}$ of this embodiment are respectively changed to 2.5 nm and 6.0 nm, and 2.5 nm and 7.5 nm, and the film thicknesses of $Co_{90}Fe_{10}$ and $Ni_{81}Fe_{19}$ are respectively changed to 1.0 nm and 7.0 nm, and 1.0 nm and 9.0 nm.

As illustrated in FIG. 6, the output linearity range of the current sensor 10 (illustrated in FIG. 2) of this embodiment is wider than that of the current sensor of the related art when the comparison is performed with the same sensitivity. In addition, as illustrated in FIG. 6, the sensitivity of the current sensor 10 (illustrated in FIG. 2) of this embodiment is higher than that of the current sensor of the related art when the comparison is performed with the same output linearity range.

In general, it is known that as the magnetic moment $M_s \cdot t$ of the free magnetic layer is increased, the output linearity range of the GMR element can be widened. Therefore, the output linearity range of the current sensor using the GMR element having a large magnetic moment $M_s \cdot t$ is wide. However, when the magnetic moment $M_s \cdot t$ is increased, as illustrated in FIG. 3, the resistance change ratio $\Delta R/R_{min}$ of the GMR element is reduced. However, in this embodiment, as illustrated in FIG. 3, a reduction in the resistance change ratio $\Delta R/R_{min}$ can be reduced to be small compared to the related art disclosed in Japanese Unexamined Patent Application Publication No. 2004-164837 even when the magnetic moment $M_s \cdot t$ is increased. Therefore, in the GMR element 1 (illustrated in FIG. 1) according to this embodiment and the current sensor 10 (illustrated in FIG. 2) using the GMR element 1 according to this embodiment, the output linearity range can be widened compared to the current sensor of the related art when the comparison is performed with the same sensitivity, and the sensitivity can be increased compared to the current sensor of the related art when the comparison is performed with the same output linearity range.

When the free magnetic layer of the GMR element is made of $Co_{90}Fe_{10}$ alloy/$(Co_{90}Fe_{10})_{80}B_{20}$ alloy, as illustrated in FIGS. 3 to 6, it is seen that the properties of the GMR element are good. Therefore, when the free magnetic layer is represented by $Co_XFe_{100-X}$ alloy/$(Co_YFe_{100-Y})_{100-Z}B_Z$ alloy, X and Y are preferably about 90 atom %, and Z is preferably about 20 atom %. Particularly, X and Y are preferably 80 atom % or more and less than 100 atom %. In addition, Z is preferably 10 atom % or more and 30 atom % or less.

When Z is less than 10 atom %, the second free magnetic layer 8b, that is, the $(Co_YFe_{100-Y})_{100-Z}B_Z$ alloy is changed from the amorphous structure to a crystal structure, and the electric resistance of the second free magnetic layer 8b is reduced and thus the resistance change ratio $\Delta R/R_{min}$ is reduced. In addition, when Z is more than 30 atom %, the saturation magnetization Ms of the second free magnetic layer 8b, that is, the $(Co_YFe_{100-Y})_{100-Z}B_Z$ alloy is reduced, and thus it is difficult to increase the magnetic moment $M_s \cdot t$ even when the film thickness T is increased. Therefore, Z is preferably 10 atom % or more and 30 atom % or less.

Therefore, by allowing Z to be 10 atom % or more and 30 atom % or less, the ferromagnetic properties of the second free magnetic layer 8b, that is, the $(Co_YFe_{100-Y})_{100-Z}B_Z$ alloy can be maintained, and the second free magnetic layer 8b, that is, the $(Co_YFe_{100-Y})_{100-Z}B_Z$ alloy can have an amorphous structure, thereby increasing the resistance change ratio $\Delta R/R_{min}$ of the GMR element. Therefore, a current sensor using the GMR element having a high resistance change ratio $\Delta R/R_{min}$ can be realized.

In this embodiment, the second free magnetic layer 8b is made of a CoFeB alloy, and is not limited thereto. An alloy having an amorphous structure due to addition of B to a ferromagnetic material such as NiFe may be employed, and an alloy having an amorphous structure due to addition of an impurity such as P other than B to a ferromagnetic material such as NiFe may also be employed.

The GMR element of this embodiment is used in the current sensor, and is not limited thereto. For example, the GMR element may also be used in a magnetic sensor which obtains a linear output, such as a magnetic sensor which detects the position of a magnetic body (magnet) that linearly moves.

A method of manufacturing the current sensor 10 illustrated in FIG. 2 will be described. An aluminum oxide film which is an insulating layer is formed on a substrate such as a silicon substrate by a method such as sputtering. Next, the laminated films which constitute the GMR element 1a or 1b illustrated in FIG. 2, that is, the antiferromagnetic layer 5, the fixed magnetic layer 6, the spacer layer 7, the free magnetic layer 8, and the like illustrated in FIG. 1 are formed by a method such as sputtering, and then photolithography and etching are performed thereon to form the GMR element 1a or 1b. In addition, a heat treatment (for example, holding at 270° C. for 2 hours) is performed thereon such that a strong exchange coupling magnetic field is generated between the antiferromagnetic layer 5 and the fixed magnetic layer 6 and the magnetization direction of the fixed magnetic layer 6 is fixed. Next, the films which constitute the fixed resistance element 2a or 2b illustrated in FIG. 2 are also formed by a method such as sputtering, and then photolithography, etching, and the like are performed thereon to form the fixed resistance element 2a or 2b.

An electrode material is formed as a film by a method such as sputtering, and then photolithography, etching, and the like are performed thereon to form electrodes and the like which electrically connect the GMR elements 1a and 1b to the fixed resistance elements 2a and 2b.

The fixed resistance elements 2a and 2b are elements in which the electric resistances are not changed by an external magnetic field. Therefore, the fixed resistance elements 2a and 2b may also be formed of an electrode material such as Cu or Al. However, in the GMR element 1 illustrated in FIG. 1, the spacer layer 7 and the free magnetic layer 8 may also be configured in the reverse order. In the latter configuration, the magnetization direction of the free magnetic layer 8 is fixed by the fixed magnetic layer 6, and thus the electric resistance is not changed by an external magnetic field. In addition, since the GMR elements 1a and 1b and the fixed resistance elements 2a and 2b are formed of the same electrode material, the electric resistances are equally changed with temperature change, and thus temperature properties are excellent.

Modification Example

Figure 7:
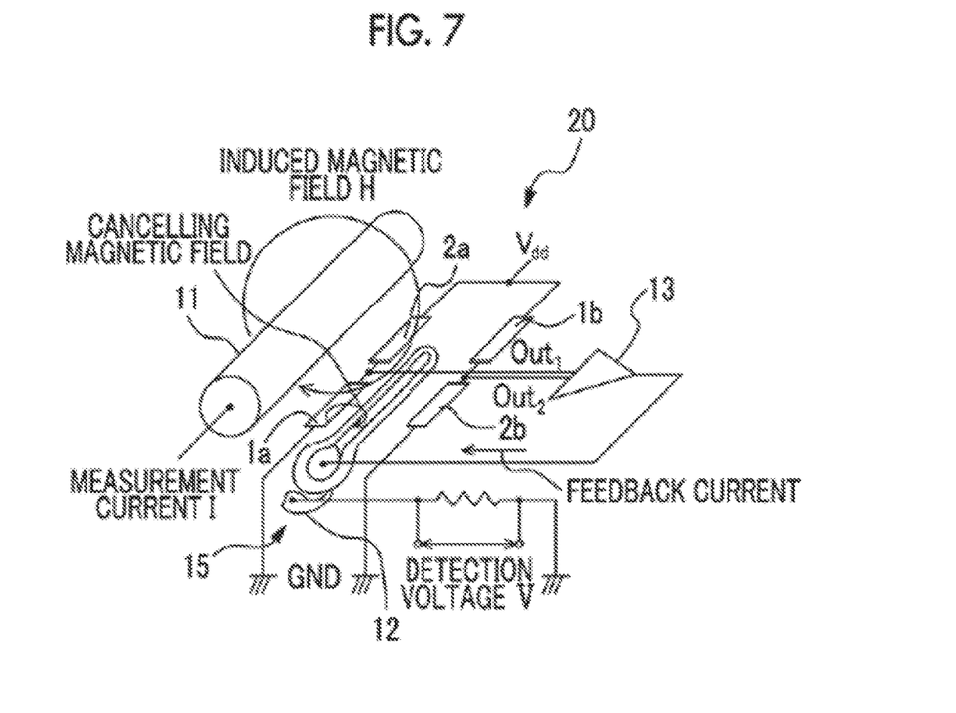
FIG. 7 is an explanatory view of a current sensor according to a modification example.

FIG. 7 is an explanatory view of a current sensor according to a modification example. The current sensor 10 of this embodiment is a magnetic proportion type current sensor as illustrated in FIG. 2. However, the current sensor 10 is not limited thereto, and may also be a magnetic balance type current sensor.

As illustrated in FIG. 7, a magnetic balance type current sensor 20 which is the modification example is disposed in the vicinity of the conductor 11 through which the measurement current I flows. The magnetic balance type current sensor 20 includes a feedback circuit 15 which generates a magnetic field (cancelling magnetic field), which cancels out the induced magnetic field H generated by the measurement current I that flows through the conductor 11. The feedback circuit 15 includes a feedback coil 12 which is wound in a direction in which the magnetic field generated by the measurement current I is cancelled out, the two GMR elements 1a and 1b which are magnetic detection elements, and the two fixed resistance elements 2a and 2b.

The electric resistances of the two GMR elements 1a and 1b are changed by the induced magnetic field H which is applied thereto from the measurement current I. The two GMR elements 1a and 1b and the two fixed resistance elements 2a and 2b constitute a bridge circuit. By using the bridge circuit as described above, the magnetic balance type current sensor 20 having high sensitivity can be realized.

In the bridge circuit illustrated in FIG. 7, the power source terminal $V_{dd}$ is connected to a connection point between the GMR element 1b and the fixed resistance element 2a, and the ground terminal GND is connected to a connection point between the GMR element 1a and the fixed resistance element 2b. Furthermore, in the bridge circuit, a single output is extracted from a connection point between the GMR element 1a and the fixed resistance element 2a, and a single output is further extracted from a connection point between the GMR element 1b and the fixed resistance element 2b. The two outputs are amplified by an amplifier 13, and are transmitted to the feedback coil 12 as a current (feedback current). The feedback current corresponds to a voltage difference due to the induced magnetic field. At this time, the cancelling magnetic field which cancels out the induced magnetic field is generated in the feedback coil 12. In addition, the measurement current I is measured by a detection voltage V corresponding to the current which flows through the feedback coil 12 in an equilibrium state in which the induced magnetic field and the cancelling magnetic field cancel out each other.

It should be understood by those skilled in the art that various modifications, combinations, sub-combinations and alterations may occur depending on design requirements and other factors insofar as they are within the scope of the appended claims or the equivalents thereof.

What is claimed is:

1. A giant magnetoresistance element comprising:
   a fixed magnetic layer in which magnetization is fixed;
   a free magnetic layer in which magnetization is changed by an external magnetic field; and
   a spacer layer disposed between the fixed magnetic layer and the free magnetic layer,
   wherein the free magnetic layer is a laminated layer formed of a CoFe alloy film and a CoFeB alloy film, and
   a thickness of the CoFe alloy film is equal to or greater than 2 nm and equal to or smaller than 4 nm, and a thickness of the CoFeB alloy film is equal to or greater than 5 nm and equal to or smaller than 14 nm or less.

2. The giant magnetoresistance element according to claim 1,
   wherein the CoFeB alloy film has an amorphous structure.

3. The giant magnetoresistance element according to claim 1,
   wherein a composition of the CoFe alloy film is represented by $Co_XFe_{100-X}$ and a composition of the CoFeB alloy film is represented by $(Co_YFe_{100-Y})_{100-Z}B_Z$, where X satisfies 80 atom %≤X<100 atom %, Y satisfies 80 atom %≤Y<100 atom %, and Z satisfies 10 atom %≤Z≤30 atom %.

4. A current sensor comprising: the giant magnetoresistance element according to claim 1.

* * * * *